(12) United States Patent
Iisaka et al.

(10) Patent No.: US 9,814,168 B2
(45) Date of Patent: Nov. 7, 2017

(54) AUTOMATIC FEEDER EXCHANGING SYSTEM

(71) Applicant: FUJI MACHINE MFG. CO., LTD., Chiryu (JP)

(72) Inventors: Jun Iisaka, Nisshin (JP); Hidetoshi Ito, Okazaki (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 15/328,543

(22) PCT Filed: Jul. 25, 2014

(86) PCT No.: PCT/JP2014/069674
§ 371 (c)(1),
(2) Date: Jan. 24, 2017

(87) PCT Pub. No.: WO2016/013107
PCT Pub. Date: Jan. 28, 2016

(65) Prior Publication Data
US 2017/0208713 A1    Jul. 20, 2017

(51) Int. Cl.
*G06F 7/00* (2006.01)
*H05K 13/02* (2006.01)
*B65G 65/00* (2006.01)

(52) U.S. Cl.
CPC ............. *H05K 13/02* (2013.01); *B65G 65/00* (2013.01); *B65G 2203/0216* (2013.01)

(58) Field of Classification Search
None
See application file for complete search history.

(56) References Cited

U.S. PATENT DOCUMENTS

| | | | |
|---|---|---|---|
| 6,717,256 B1* | 4/2004 | Suzuki | H01L 24/97 257/100 |
| 2007/0142962 A1* | 6/2007 | Takizawa | H01L 21/67265 700/218 |
| 2014/0150254 A1* | 6/2014 | Kasuga | H05K 13/021 29/832 |

FOREIGN PATENT DOCUMENTS

| | | |
|---|---|---|
| JP | 6-15534 A | 1/1994 |
| JP | 2001-127487 A | 5/2001 |
| JP | 2007-242757 A | 9/2007 |
| JP | 2008-78235 A | 4/2008 |
| JP | 2012-099614 A | 5/2012 |
| WO | 2004/103052 A1 | 11/2004 |

OTHER PUBLICATIONS

International Search Report dated Oct. 7, 2014 in PCT/JP2014/069674 filed Jul. 25, 2014.

* cited by examiner

*Primary Examiner* — Yolanda Cumbess
(74) *Attorney, Agent, or Firm* — Oblon, McClelland, Maier & Neustadt, L.L.P.

(57) ABSTRACT

An automatic feeder exchanging system that automatically exchanges a feeder for which exchange is necessary from multiple feeders set in a feeder setting area of a component mounter.

7 Claims, 7 Drawing Sheets

AUTOMATIC FEEDER EXCHANGING SYSTEM

TECHNICAL FIELD

The present application relates to an automatic feeder exchanging system that automatically exchanges a feeder for which exchange is necessary from multiple feeders set in a feeder setting area of a component mounter.

BACKGROUND ART

With conventional component mounters, as disclosed in patent literature 1 (WO2004/103052) and patent literature 2 (JP-A-2012-99614), multiple feeders are set on a feeder setting table of the component mounter, mounting onto a circuit board is performed by picking up components supplied by each feeder with a suction nozzle, and each time a feeder runs out of components, an operator performs feeder exchange work by removing the feeder for which parts have run out from the feeder setting table, and setting a feeder that supplies the same components onto the feeder setting table.

Further, in patent literature 1, to allow an operator to perform feeder exchange work efficiently, the time remaining until components run out is indicated to the operator, such that the operator has enough time to prepare a feeder that supplies the same components before the components run out.

However, because many feeders are set on a component mounter, there are cases in which exchange periods for feeders overlap, and because it is difficult for one operator to exchange multiple used feeders for which components have run out during the same exchange period, operation of the component mounter is stopped until exchange work for all the feeders that have run out of components is completed, meaning that the operating rate of the component mounter drops, which is undesirable.

As a countermeasure, in patent literature 2, a feeder exchange work plan is created to spread out feeder exchange periods such that feeder exchange work is not concentrated in a given period, and operators exchange feeders according to the feeder exchange work plan.

CITATION LIST

Patent Literature

Patent Literature 1: WO2004/103052
Patent Literature 1: JP-A-2012-99614

SUMMARY

However, with patent literature 2, when creating a feeder exchange work plan, priority is given to spreading out the feeder exchange periods, so feeders are exchanged before components have run out, meaning that components on feeders are not used up completely, which increases production costs. Further, because operators must perform feeder exchange work according to the feeder exchange work plan, the burden on operators is large.

Therefore, an object of the present disclosure is to provide an automatic feeder exchanging system that automates feeder exchange work, does not cause operation of a component mounter to stop during feeder exchange work, and allows components in feeders to be completely used up, thus lowering production costs.

To solve the above problems, the present disclosure is an automatic feeder exchanging system that automatically exchanges a feeder for which exchange is necessary from multiple feeders set in a feeder setting area of a component mounter, the automatic feeder exchanging system including: a feeder stocking area at which a feeder to be exchanged with the feeder for which exchange is necessary stands by; an exchange robot that pulls out the feeder for which exchange is necessary from the feeder setting area and pulls out a feeder that supplies the same components as the feeder for which exchange is necessary from the multiple feeders standing by at the feeder stock area; a storage device that, in a case in which the feeder pulled out from the feeder setting area is a feeder with components remaining, stores a link between the component remaining quantity and the feeder; and an exchange period setting device that sets an exchange period of each feeder set in the feeder setting area such that the exchange period of each feeder does not overlap with the exchange period of another feeder, wherein the exchange robot, at the exchange period set by the exchange period setting device, pulls out the feeders from the feeder setting area for which the exchange period has arrived, collects at least the feeders with components remaining into the feeder stock area, pulls out feeders that supply the same components as the feeders for which the exchange period has arrived from the multiple feeders standing by in the feeder stock area, and sets the feeders pulled out from the feeder stock area in the feeder setting area, and the exchange period setting device, when the exchange robot sets the feeders with components remaining in the feeder setting area, sets the exchange period of the feeders with components remaining using the component remaining quantity stored in the storage device.

With this configuration, because each feeder set in the feeder setting area of a component mounter is exchanged by the exchange robot for a feeder that supplies the same components, it is not necessary for an operator to perform feeder exchange work, thus saving labor. Further, because setting is performed such that the exchange period of each feeder set in the feeder setting area does not overlap the exchange period of other feeders, feeders are exchanged automatically without stopping operation of the component mounter, thereby improving the operation rate of the component mounter. Even further, in a case in which a feeder pulled out from the feeder setting area is a feeder with components remaining, because the feeder with components remaining is collected for re-use in the feeder stock area, feeders can be used until all the components are used up, thus reducing production costs. Note that, with the present disclosure, the quantity of feeder exchanges increases compared to conventional technology, but because the feeder exchange work is performed by the exchange robot, there is no increase in work for operators.

Here, the exchange period setting device may calculate the time at which components will run out for each of the feeders set in the feeder setting area, set the exchange period of each feeder for which a component run-out time does not overlap with another feeder as the component run-out time for those feeders, set the exchange period of only one feeder for which the component run-out time overlaps as the component run-out time, and set the exchange period for other feeders to a time earlier than the component run-out time such that the exchange periods for each feeder do not overlap. By doing this, when the exchange period of each feeder set in the feeder setting area is set as the component run-out time, it is possible to set the exchange period for only feeders for which the exchange period overlaps as a period before the component run-out period such that the exchange period of feeders does not overlap, meaning that the quantity of feeders with components remaining pulled out from the feeder setting area can be minimized, and the increase in the quantity of feeder exchanges can be minimized.

Also, the present disclosure may be provided with a used feeder collection area in which used feeders for which components have been completely used up are collected, wherein the exchange robot, in a case in which the feeder pulled out from the feeder setting area is a used feeder, collects the used feeder in the used feeder collection area. Accordingly, it is possible to separate used feeders for which components have been completely used up and feeders with components remaining when collecting the feeders, thus removing used feeders from the component mounter becomes easy.

Also, the present disclosure may be provided with a feeder monitoring device that monitors whether feeders that supply the same components as each of the feeders set in the feeder setting area are present in the feeder stock area, and a guidance device that guides an operator with at least one of a display or a sound to replenish the feeder stock area with feeders that supply components for feeders of components that the feeder monitoring device has determined are not present in the feeder stock area. Accordingly, in a case in which a feeder that supplies the same components as each of the feeders set in the feeder setting area is not present in the feeder stock area, guidance is issued to an operator to replenish the feeder in the feeder stock area, which leads to an advantage in that work of replenishing feeders to the feeder stock area is performed by operators without delay and reliably.

Also, the present disclosure may be configured such that an identification information recording section on which feeder identification information is recorded or stored is provided on the feeders, an identification information reading section that reads the feeder identification information from the identification recording section of the feeders standing by in the feeder stock area is provided in the feeder stock area, and a control device that controls the exchange robot identifies the feeders based on the feeder identification information sent from the identification information reading section. Accordingly, whichever order the multiple feeders standing by in the feeder stock area are lined up in, the feeder to be exchanged can be reliably selected to be pulled out from the multiple lined-up feeders and set in the feeder setting area, based on the feeder identification information. Also, when replenishing a feeder to the feeder stock area, because feeders may be lined up in any order, it is possible to replenish feeders into any empty space (empty slot), such that feeder replenishment work to the feeder stock area can be performed easily even if it is being performed by an operator.

Also, a feeder transport conveyor that performs loading of feeders for replenishment to the feeder stock area and unloading of used feeders, and a switching robot that switches feeders between the conveyor and the feeder stock area may be provided. Accordingly, loading of feeders to the feeder stock area and unloading of used feeders may be performed freely.

Feeders used in the present disclosure may be cassette-type feeders provided with a tape loading section that loads wound component supply tape, a tape feed mechanism that feeds component supply tape pulled out from the tape loading section to a component pickup position, a cover tape peeling mechanism that exposes components in the component supply tape by peeling cover tape from the component supply tape forward of the component pickup position, and a cassette case built into which are the tape loading section, the tape feed mechanism, and the cover tape peeling mechanism. Accordingly, if cassette-type feeders are used, handling during automatic exchange is easy.

DESCRIPTION OF EMBODIMENTS

Figure 3:
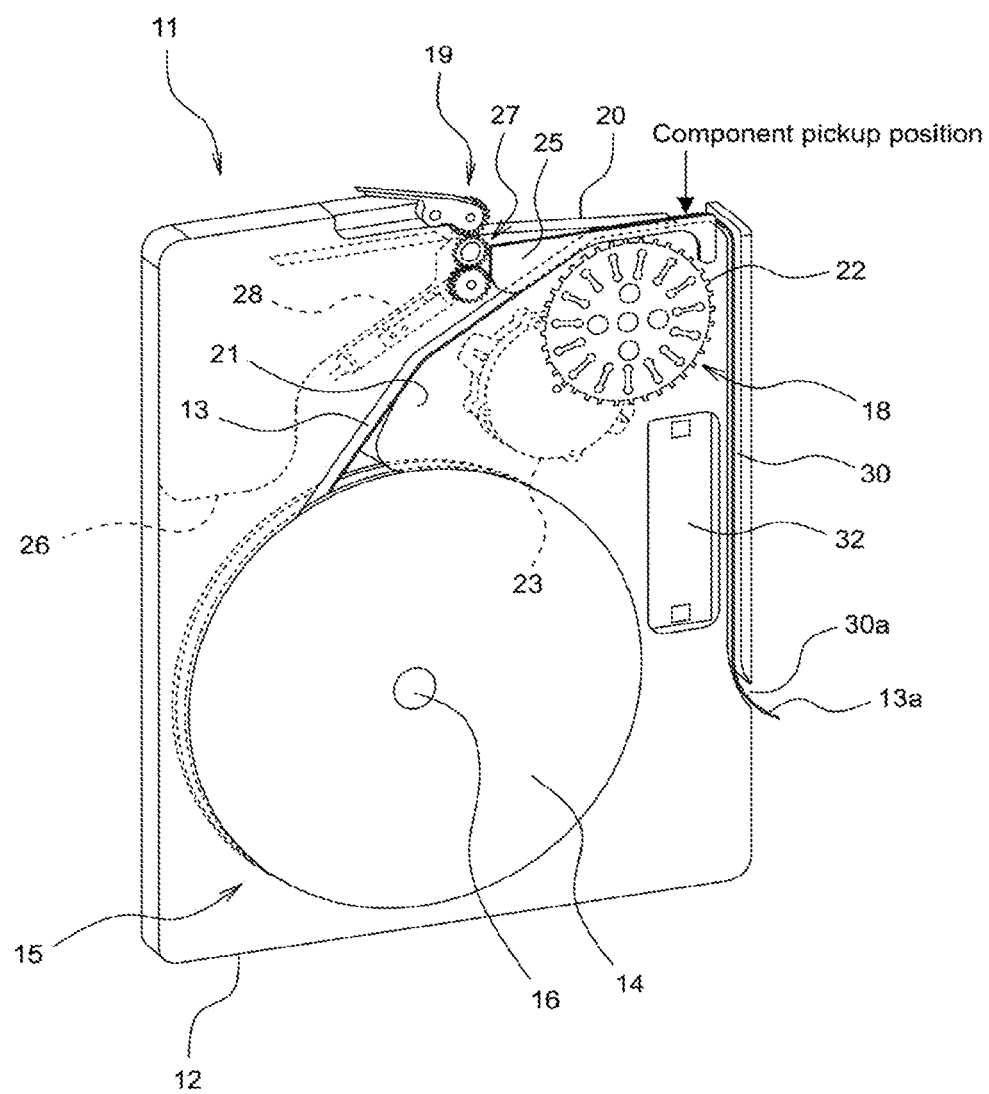
FIG. 3 is a perspective view of a cassette-type feeder.

An embodiment of the disclosure is described below. First, the configuration of cassette-type feeder 11 is described based on FIG. 3.

Cassette case 12 of cassette-type feeder 11 is formed of a transparent or opaque plastic plate, a metal plate, or the like, and the side surface (cover) is capable of opening and closing. Tape loading section 15, in which tape reel 14 around which component supply tape 13 is wound is loaded in a detachable (exchangeable) manner, is provided inside cassette case 12. Reel holding shaft 16 that holds tape reel 14 in a rotatable manner is provided in the center of tape loading section 15.

Tape feed mechanism 18 that feeds the component supply tape 13 which is pulled out from tape reel 14 to the component pickup position, and cover tape peeling mechanism 19 that peels cover tape 20 from component supply tape 13 forward from the component pickup position to expose components in component supply tape 13 are provided inside cassette case 12. The component pickup position is in the vicinity of the end portion of the tape feeding direction side of the top surface of cassette case 12. Tape guide 21 that guides component supply tape 13 which is pulled out from tape reel 14 to the component pickup position is provided inside cassette case 12.

Tape feed mechanism 18 is formed from sprocket 22 which is provided in the vicinity below the component pickup position, and motor 23 that drives sprocket 22 to rotate, and tape feed mechanism 18 pitch feeds component supply tape 13 to the component pickup position by engaging the teeth of sprocket 22 with tape feeding holes which are formed in the edge of one side of component supply tape 13 at a predetermined pitch and rotating sprocket 22.

Cover tape peeling mechanism 19 is formed from tape retainer 25 for retaining the component supply tape 13 before the component pickup position and peeling cover tape 20 from the top surface of component supply tape 13, cover tape feed gear mechanism 27 that pulls cover tape 20 which is peeled by tape retainer 25 in the opposite direction from the tape feeding direction to feed cover tape 20 into cover tape collection section 26, which is provided on the top portion of cassette case 12, motor 28 that drives cover tape feed gear mechanism 27, and the like.

Waste tape disposal path 30 that guides waste tape 13a (in the first embodiment, only the carrier tape from which cover tape 20 has been peeled), which has passed the component pickup position and from which the components have been removed, downward to dispose of waste tape 13a, is provided extending downwards at the end section of the tape feeding direction side within cassette case 12, and outlet 30a of waste tape disposal path 30 is provided in a position closer to the bottom side than the center of the end surface of the tape feeding direction side of cassette case 12. An air inlet (not shown) is provided in the top portion of waste tape disposal path 30 so as to be open in the end surface of the tape feeding direction side within the cassette case 12, and is configured to allow air to enter waste tape disposal path 30 from the air inlet and to cause a downward flow of the air within waste tape disposal path 30.

Control device 32 that controls motor 23 of tape feed mechanism 18 and motor 28 of cover tape peeling mechanism 19 is provided within cassette case 12. In addition, while not shown in the drawings, a connector for communication and power that is connected to the connector for communication and power on the automatic feeder exchange system 34 side is provided in cassette case 12.

An identification information recording section (not shown) that records or stores feeder identification information (hereinafter given as a "feeder ID") is provided at a predetermined position in cassette case 12. As the identification information recording section, for example, a code label in which the feeder ID is recorded as a bar-code, a two-dimensional code, or the like may be used, or an electronic tag (also referred to as an RF tag, an IC tag, an electromagnetic wave tag, a wireless tag, or the like) which stores the data of the feeder ID may be used.

Figure 1:
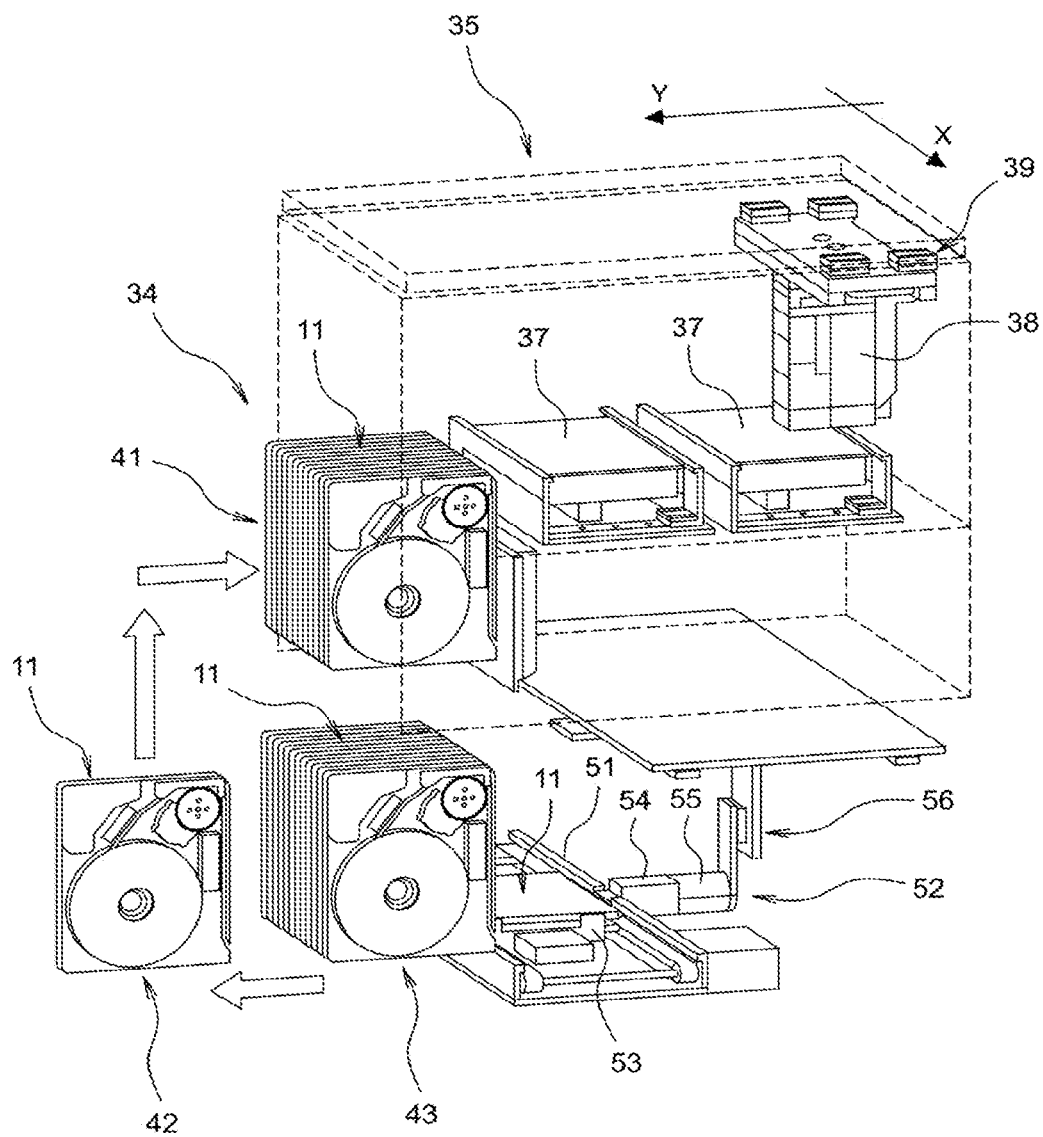
FIG. 1 is a perspective view showing an embodiment of the present disclosure of an automatic feeder exchange system (an exchange robot is not shown) of a component mounter.
Figure 2:
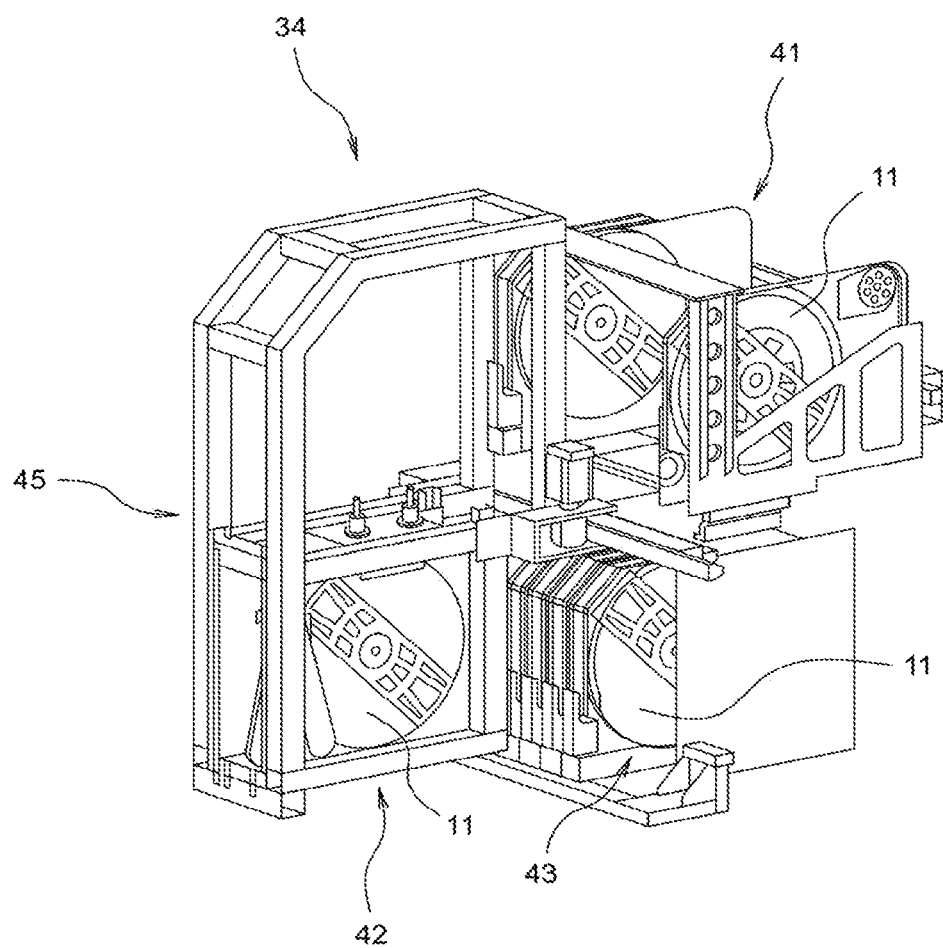
FIG. 2 is a perspective view of the main configuration components of the automatic feeder exchange system.
Figure 4:
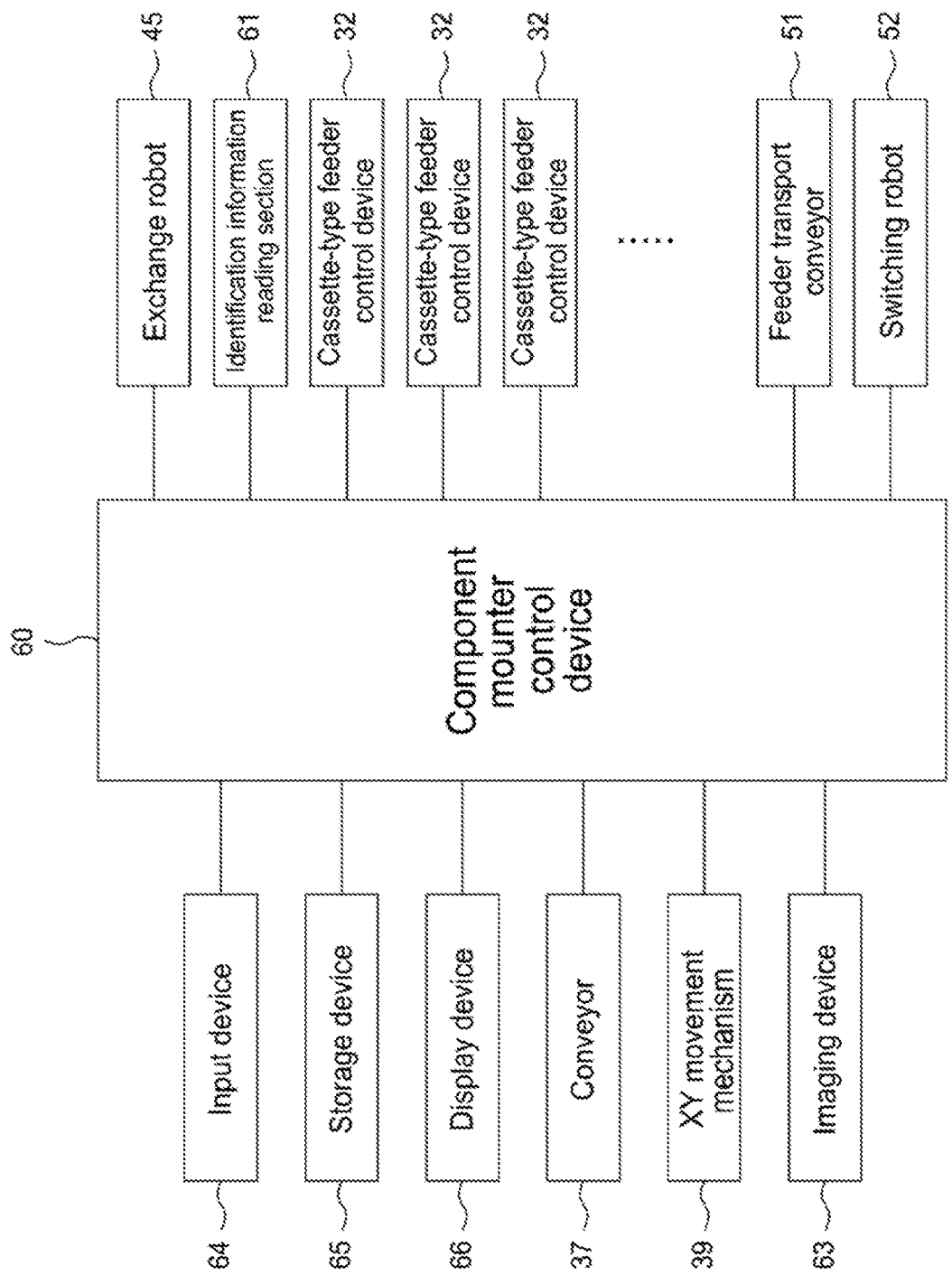
FIG. 4 is a block diagram showing control items of the automatic feeder exchange system.
Figure 5:
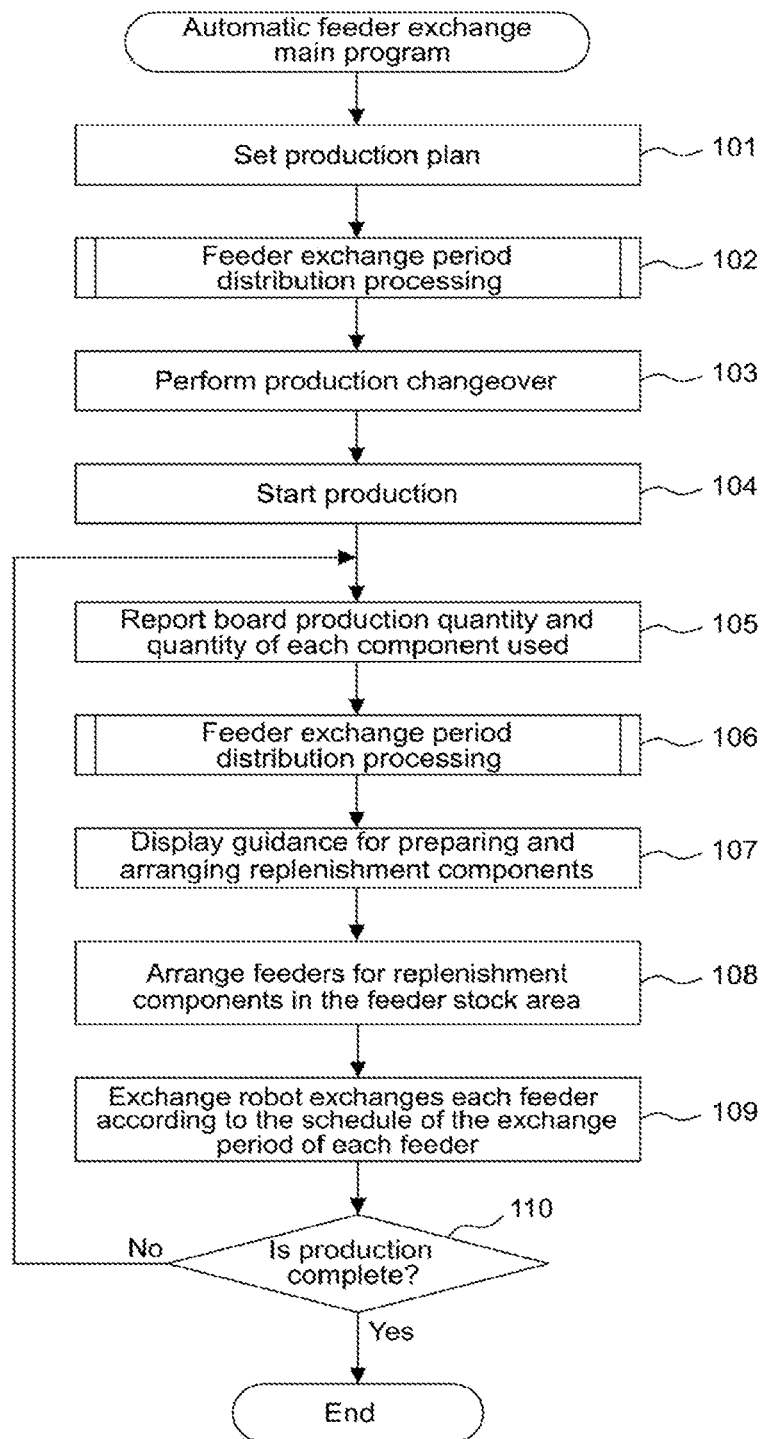
FIG. 5 is a flowchart showing the processing flow of the automatic feeder exchange main program.
Figure 6:
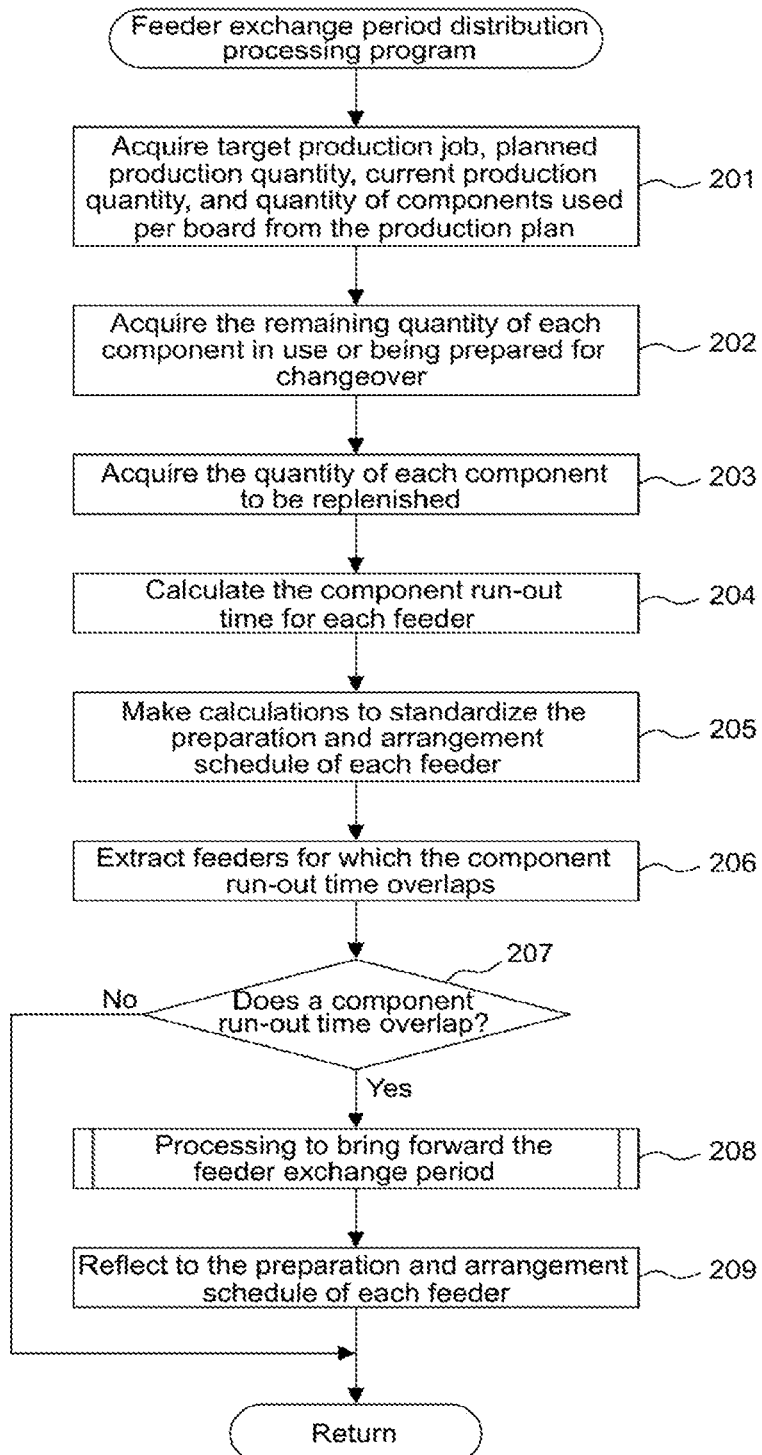
FIG. 6 is a flowchart showing the processing flow of the feeder exchange period distribution processing program.
Figure 7:
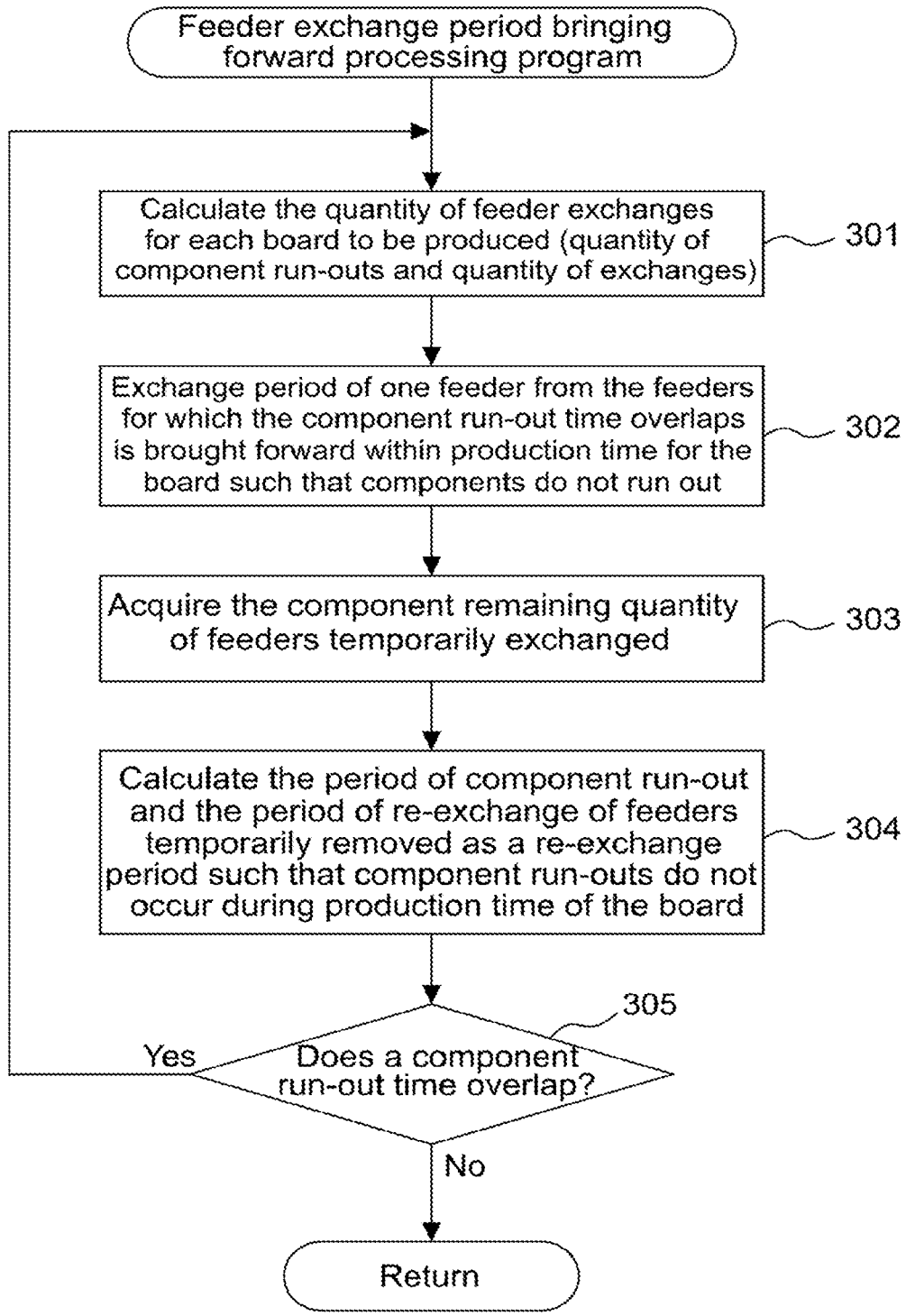
FIG. 7 is a flowchart showing the processing flow of the feeder exchange period bringing forward processing program.

Next, automatic feeder exchange system 34 that uses the above cassette-type feeder 11 is described using FIGS. 1, 2, and 4. As shown in FIG. 1, component mounter 35 is provided with two conveyors 37 that transport a circuit board, mounting head 38 that holds a nozzle (not shown) which picks up a component supplied from cassette-type feeder 11 and mounts the component on the circuit board, XY movement mechanism 39 that moves mounting head 38 in the X and Y directions (left, right, forward, and backward directions), imaging device 63 (refer to FIG. 4) that images the component picked up by the nozzle, and the like. Also, as shown in FIG. 4, connected to control device 60 of component mounter 35 are input device 64 such as a keyboard, mouse, or touch panel, storage device 65 (storage device) such as a hard disk, RAM, or ROM that stores the programs and data used for automatic feeder exchange which are shown in FIGS. 5 to 7 and which are described in detail later, and display device 66 such as an LCD display or CRT.

Automatic feeder exchange system 34 is detachably arranged on the front (the Y direction orthogonally intersecting the X direction, which is the transport direction of conveyors 37) of component mounter 35. Feeder setting area 41, feeder switching area 42, and feeder stock area 43 are attached to automatic feeder exchange system 34. Feeder setting area 41 is positioned to the front of conveyor 37 (in the Y direction) and is an area in which multiple cassette-type feeders 11 that supply components to the component pickup position of component mounter 35 are lined up. In this feeder setting area 41, a connector (not shown) for communication and power that connects to a connector for communication and power on the cassette-type feeder 11 is provided, and by connecting these connectors, sending and receiving of control signals and the like is performed between control device 32 inside cassette case 12 and control device 60 (refer to FIG. 4) of component mounter 35, and power is supplied to control device 32 inside cassette case 12 and the like.

Feeder stock area 43 is arranged below feeder setting area 41. Feeder stock area 43 stores cassette-type feeders 11 to be exchanged with cassette-type feeders 11 inside feeder setting area 41 for which exchange is required, and is used for collecting cassette-type feeders 11 removed from feeder setting area 41. Slots into each of which one cassette-type feeder 11 is set are formed in feeder stock area 43, the quantity of slots being sufficient to store the quantity of cassette-type feeders 11 in feeder stock area 43; also provided is an identification information reading section 61 (refer to FIG. 4) for reading the feeder ID from the identification information recording section of the cassette-type feeder 11 set in each slot; the feeder ID read by identification information reading section 61 is sent to control device 60 (control device) of component mounter 35, which is a control device of automatic feeder exchange system 34, so as to automatically identify the component type and so on of the cassette-type feeder 11 set in each slot.

Accordingly, whichever order the multiple cassette-type feeders 11 standing by in feeder stock area 43 are lined up in, the cassette-type feeder 11 to be exchanged can be reliably selected to be pulled out from the multiple lined-up cassette-type feeders 11 and set in feeder setting area 41, based on the feeder ID. Also, when replenishing a cassette-type feeder 11 to feeder stock area 43, because cassette-type feeders 11 may be lined up in any order, it is possible to replenish cassette-type feeders 11 into any empty space (empty slot), such that cassette-type feeder 11 replenishment work to feeder stock area 43 can be performed easily even if it is being performed by an operator.

Note that, in the present embodiment, all cassette-type feeders 11 removed from feeder setting area 41 are collected into feeder setting area 43, but the present disclosure is not limited to this configuration; for example, a used feeder collection area (not shown) may be arranged adjacent to feeder stock area 43, and among cassette-type feeders 11 removed from feeder setting area 41, used (run out of components) cassette-type feeders 11 for which components have been completely used up, may be collected in the used feeder collection area, and only cassette-type feeders 11 with components remaining collected in feeder stock area 43. Accordingly, it is possible to separate used cassette-type feeders 11 for which components have been completely used up and cassette-type feeders 11 with components remaining when collecting the cassette-type feeders 11, thus removing used cassette-type feeders 11 from component mounter 35 becomes easy.

Feeder switching area 42 is arranged in front of feeder stock area 43 and feeder setting area 41; feeder switching area 42 is used when cassette-type feeders 11 are switched between feeder stock area 43 and feeder setting area 41. Exchange robot 45 (refer to FIGS. 2 and 4) is provided in this feeder switching area 42. This exchange robot 45 removes cassette-type feeders 11 for which exchange is necessary from feeder setting area 41, removes cassette-type feeders 11 with the same components as the cassette-type feeders 11 for which exchange is necessary from among the multiple cassette-type feeders 11 standing by in feeder stock area 41, and sets those cassette-type feeders 11 in feeder setting area 41.

Also, control device 60 of component mounter 35 also functions as a feeder monitoring device that monitors whether cassette-type feeders 11 that supply the same components as each of the cassette-type feeders 11 set in feeder setting area 41 are present in feeder stock area 43, based on feeder IDs read by identification information reading section 61, and also functions as a guidance device that guides an operator with at least one of a display or a sound of display device 66 to replenish feeder stock area 43 with cassette-type feeders 11 that supply components for cassette-type feeders 11 of components that the feeder monitoring device has determined are not present in feeder stock area 43. Accordingly, in a case in which a cassette-type feeder 11 that supplies the same components as each of the cassette-type feeders 11 set in feeder setting area 51 is not present in feeder stock area 43, guidance is issued to an operator to replenish the cassette-type feeder 11 in feeder stock area 43, which leads to an advantage in that work of replenishing cassette-type feeders 11 to feeder stock area 43 is performed by operators without delay and reliably.

Further, in the present embodiment, the configuration is such that replenishment of cassette-type feeders 11 to feeder stock area 43 is automated. Specifically, feeder transport conveyor 51 that performs loading of cassette-type feeders 11 for replenishment to feeder stock area 43 and unloading of used cassette-type feeders 11, is provided at a lower section of component mounter 35, and the configuration is also provided with switching robot 52 that switches cassette-type feeders 11 between feeder transport conveyor 51 and feeder stock area 43.

Feeder transport conveyor 51 is provided to transport cassette-type feeders 11 in a state lying horizontally in the same direction (X direction) as the conveyance direction of conveyor 37 for conveying the circuit board. Stopper 53 for stopping loaded cassette-type feeders 11 at a position to the rear of feeder stock area 43 is provided on feeder transport conveyor 51 in a raisable/lowerable manner.

Switching robot 52 is configured from clamp mechanism 54 that clamps cassette-type feeder 11, rotating mechanism 55 that rotates clamp mechanism 54 around a horizontal axis, and moving mechanism 56 that moves clamp mechanism 54 in an up/down direction and XY direction (horizontal direction).

Described next is operation of feeder transport conveyor 51 and switching robot 52. When a cassette-type feeder 11 to be replenished into feeder stock area 43 is loaded on conveyor 51, stopper 53 protrudes upwards, such that the cassette-type feeder 11 is stopped at a position to the rear of feeder stock area 43. Then, switching robot 52 is operated such that cassette-type feeder 11 is clamped by clamp mechanism on feeder transport conveyor 51 in a state lying horizontally, clamp mechanism 54 is raised by moving mechanism 56, the cassette-type feeder 11 is raised from feeder transport conveyor 51 such that space for rotating cassette-type feeder 11 is provided. Then, after rotating cassette-type feeder 11 90 degrees by rotating clamp mechanism 54 90 degrees by rotating mechanism 55, clamp mechanism 54 is moved in a direction (X direction) parallel to feeder transport conveyor 51 by moving mechanism 56, the cassette-type feeder 11 is aligned with an empty slot in feeder stock area 43, and the cassette-type feeder 11 is stored in the empty slot of feeder stock area 43.

On the other hand, when removing a used cassette-type feeder 11 from feeder stock area 43, as well as stopper 53 being retracted downwards, a used cassette-type feeder 11 of feeder stock area 43 is clamped by clamp mechanism 54 and pulled out, then the cassette-type feeder 11 is made horizontal from a upright state by clamp mechanism 54 being rotated 90 degrees by rotating mechanism 55, and then loaded on feeder transport conveyor 51.

Next, a method of automatically exchanging cassette-type feeders 11 after spreading out the exchange periods of the multiple cassette-type feeders 11 set in feeder setting area 41 of component mounter 35 using automatic feeder exchange system 34 configured as given above is described. Control device 60 of component mounter 35, which is a control device of automatic feeder exchange system 34, in a case in which cassette-type feeders 11 removed from feeder setting area 41 are cassette-type feeders 11 with components remaining, is provided with a function to store a link between the component remaining quantity and the feeder ID of the cassette-type feeder 11 in storage device 65, and functions as the exchange period setting device that sets the exchange period of each of the cassette-type feeders 11 set in feeder setting area 41 such that the exchange period of each cassette-type feeder 11 does not overlap with the exchange period of another cassette-type feeder 11; control device 60 also controls operation of exchange robot 45 to, at the set exchange period, pull out cassette-type feeders 11 from feeder setting area 41 for which the exchange period has arrived and collect them in feeder stock area 43, and pull out cassette-type feeders 11 that supply the same components as the cassette-type feeders 11 for which the exchange period has arrived from the multiple cassette-type feeders 11 standing by in feeder stock area 43 and set them in feeder setting area 41.

Further, control device 60 of component mounter 35, in a case in which exchange robot 45 sets cassette-type feeders 11 with components remaining in feeder setting area 41, sets the exchange period of the cassette-type feeders 11 with components remaining using the component remaining quantity that corresponds to the feeder ID of the cassette-type feeder 11 from storage device 65. Specifically, control section 60 calculates the time at which components will run out for each of the cassette-type feeders 11 set in feeder setting area 41, sets the exchange period of each cassette-type feeder 11 for which the component run-out time does not overlap with another cassette-type feeder 11 as the component run-out time for those cassette-type feeders 11, sets the exchange period of only one cassette-type feeder 11 for which the component run-out time overlaps as the component run-out time, and sets the exchange period for other cassette-type feeders 11 to a time earlier than the component run-out time such that the exchange periods for each cassette-type feeder 11 do not overlap. Accordingly, when the exchange period of each cassette-type feeder 11 set in feeder setting area 41 is set as the component run-out time, it is possible to set the exchange period for only cassette-type feeders 11 for which the exchange period overlaps as a period before the component run-out period such that the exchange period of cassette-type feeders 11 does not overlap, meaning that the quantity of cassette-type feeders 11 with components remaining pulled out from feeder setting area 41 can be minimized, and the increase in the quantity of feeder exchanges can be minimized.

Automatic exchange of cassette-type feeders 11 of the present embodiment as described above is performed as follows by control device 60 of component mounter 35 according to the automatic feeder exchange programs of FIGS. 5 to 7.

Automatic Feeder Exchange Main Program

The automatic feeder exchange main program of FIG. 5 is started before production starts, and, after setting the production plan in step 101 first, progresses to step 102, wherein the feeder exchange period distribution processing program of FIG. 6, which is described below, is run, such that the exchange period of each cassette-type feeder 11 set in feeder setting area 41 of component mounter 35 is spread out. Then, continuing to step 103, production changeover is performed, with production being started in step 104.

During production, in step 105, the quantity of boards produced, and the usage quantity of each component is reported to control device 60. Then, progressing to step 106, the feeder exchange period distribution processing program of FIG. 6, which is described below, is run again, such that the exchange period of each cassette-type feeder 11 set in feeder setting area 41 is spread out. Then, progressing to step 107, monitoring is performed as to whether cassette-type feeders 11 that supply the same components as each of the cassette-type feeders 11 set in feeder setting area 41 are present in feeder stock area 43, and operators are guided by a display or sound of display device 66 to prepare and arrange cassette-type feeders 11 for components determined not to be present in feeder stock area 43. The processing of step 107 corresponds to the feeder monitoring device and guidance device of the claims.

Then, in step 108, cassette-type feeders 11 prepared by the operator are loaded into automatic feeder exchange system 34 by feeder transport conveyor 51, and arranged in feeder stock area 43 by switching robot 52. Then, in step 109, cassette-type feeders 11 for which the exchange time has arrived are removed from feeder setting area 41 by exchange robot 45 based on the exchange period schedule of each cassette-type feeder 11 set in feeder setting area 41 of component mounter 35 and are collected into feeder stock area 43, and cassette-type feeders 11 with the same components as the cassette-type feeders 11 for which the exchange period has arrived from among the multiple cassette-type feeders 11 standing by in feeder stock area 43 are removed and set in feeder setting area 41.

Then, progressing to step 110, it is determined whether production is complete, and if it is determined that production is still on-going, processing of the above steps 105 to 110 is performed again. Accordingly, until production is complete, processing of the above steps 105 to 110 is performed repeatedly at a specified interval, with the program finishing when production has finished.

Feeder Exchange Period Distribution Processing Program

The feeder exchange period distribution processing program of FIG. 6 is a subroutine performed during steps 102 and 106 of the automatic feeder exchange main program of FIG. 5, and performs the role of the exchange period setting device of the claims. When this program is started, after first acquiring the target production job, planned production quantity, current production quantity, and quantity of components used per board from the production plan in step 201, progressing to step 202, the remaining quantity of each component in use or being prepared for changeover is acquired, and, in step 203, the quantity of each component to be replenished is acquired.

Then, progressing to step 204, after the component run-out time of each cassette-type feeder 11 set in feeder setting area 41 of component mounter 35 is calculated, progressing to step 205, calculations are made to standardize the preparation and arrangement schedule of each cassette-type feeder 11. Then, progressing to step 206, cassette-type feeders 11 for which the component run-out time overlaps are extracted.

Then, in step 207, it is determined whether the component run-out times of cassette-type feeders 11 overlap, and if it is determined that they do not overlap, because it is not necessary to spread out the exchange periods of cassette-type feeders 11, the program finishes without performing subsequent processing.

Conversely, if it is determined in step 207 that the component run-out times of cassette-type feeders 11 overlap, processing progresses to step 208, the feeder exchange period bringing forward processing program of FIG. 7, which is described below, is run, and exchange periods are brought forward such that the exchange period of each cassette-type feeder 11 does not overlap. Then, progressing to step 209, the changes are reflected to the preparation and arrangement schedule of each cassette-type feeder 11, and then the program finishes.

Feeder Exchange Period Bringing Forward Processing Program

The feeder exchange period bringing forward processing program of FIG. 7 is a subroutine performed during step 208 of the feeder exchange period distribution processing program of FIG. 6, and performs the role of the exchange period setting device of the claims. When this program is started, first, in step 301, the quantity of feeder exchanges (quantity of component run-outs and quantity of exchanges) for each board being produced is calculated.

Then, progressing to step 302, the exchange period of one cassette-type feeder 11 from the multiple cassette-type feeders 11 for which the component run-out time overlaps is brought forward within production time for the board such that components do not run out. Then, progressing to step 303, the component quantity of cassette-type feeders 11 with components remaining except for those temporarily exchanged is acquired. Then, progressing to step 304, the period of component run-out and the period of re-exchange of cassette-type feeders 11 with components remaining except for those temporarily exchanged is calculated as a re-exchange period such that component run-outs do not occur during production time of the board.

Then, progressing to step 305, it is determined whether the component run-out time for each cassette-type feeder 11 overlaps, and if it is determined that component run-out times overlap, processing of the above steps 301 to 305 is performed again. By this, processing to bring forward the exchange period of cassette-type feeders 11 for which the component run-out time overlaps is repeated until it is determined that the component run-out time for each cassette-type feeder 11 does not overlap, and the program finishes when component run-out times for each cassette-type feeder 11 no longer overlap.

According to the embodiment described above, because each cassette-type feeder 11 set in feeder setting area 41 of component mounter 35 is exchanged by exchange robot 45 for a cassette-type feeder 11 that supplies the same components, it is not necessary for an operator to perform feeder exchange work, thus saving labor. Further, because setting is performed such that the exchange period of each cassette-type feeder 11 set in feeder setting area 41 does not overlap the exchange period of other cassette-type feeders 11, cassette-type feeders 11 are exchanged automatically without stopping operation of component mounter 35, thereby improving the operation rate of the component mounter. Even further, in a case in which a cassette-type feeder 11 pulled out from feeder setting area 41 is a cassette-type feeder 11 with components remaining, because the cassette-type feeder 11 with components remaining is collected for re-use in feeder stock area 43, cassette-type feeders 11 can be used until all the components are used up, thus reducing production costs. Note that, with the present embodiment, the quantity of cassette-type feeder 11 exchanges increases compared to conventional technology, but because the feeder exchange work is performed by exchange robot 45, there is no increase in work for operators.

The present invention is not limited to a configuration using cassette-type feeders 11, a configuration using non-cassette-type feeders may be used, and, it goes without saying that various embodiments with changes that do not extend beyond the scope of the invention are possible, such as appropriate changes to the configuration of the exchange robot.

REFERENCE SIGNS LIST

11: cassette-type feeder; 12: cassette case; 13: component supply tape; 13a: waste tape; 14: tape reel; 15: tape loading section; 16: reel holding shaft; 18: tape feed mechanism; 19: cover tape peeling mechanism; 21: tape guide; 22: sprocket; 25: tape retainer; 26: cover tape collection section; 27: cover tape feed gear mechanism; 28: motor; 30: waste tape disposal path; 32: control device; 34: automatic feeder exchange system; 35: component mounter; 37: conveyor; 38: mounting head; 39: XY movement mechanism; 41: feeder setting area; 42: feeder switching area; 43: feeder stock area; 45: exchange robot; 51: feeder transport conveyor; 52: switching robot; 60: control device (control device, exchange period setting device, feeder monitoring device, guidance device); 61: identification information reading section; 65: storage device (recording device); 66: display device

The invention claimed is:

1. An automatic feeder exchanging system that automatically exchanges a feeder for which exchange is necessary from multiple feeders set in a feeder setting area of a component mounter, the automatic feeder exchanging system comprising:
    a feeder stocking area at which a feeder to be exchanged with the feeder for which exchange is necessary stands by;
    an exchange robot that pulls out the feeder for which exchange is necessary from the feeder setting area and pulls out a feeder that supplies the same components as the feeder for which exchange is necessary from the multiple feeders standing by at the feeder stock area;
    a storage means that, in a case in which the feeder pulled out from the feeder setting area is a feeder with components remaining, stores a link between the component remaining quantity and the feeder; and
    an exchange period setting means that sets an exchange period of each feeder set in the feeder setting area such that the exchange period of each feeder does not overlap with the exchange period of another feeder,
    wherein
    the exchange robot, at the exchange period set by the exchange period setting means, pulls out the feeders from the feeder setting area for which the exchange period has arrived, collects at least the feeders with components remaining into the feeder stock area, pulls out feeders that supply the same components as the feeders for which the exchange period has arrived from the multiple feeders standing by in the feeder stock area, and sets the feeders pulled out from the feeder stock area in the feeder setting area, and
    the exchange period setting means, when the exchange robot sets the feeders with components remaining in the feeder setting area, sets the exchange period of the feeders with components remaining using the component remaining quantity stored in the storage means.

2. The automatic feeder exchanging system according to claim 1, wherein
    the exchange period setting means calculates the time at which components will run out for each of the feeders set in the feeder setting area, sets the exchange period of each feeder for which a component run-out time does not overlap with another feeder as the component run-out time for those feeders, sets the exchange period of only one feeder for which the component run-out time overlaps as the component run-out time, and sets the exchange period for other feeders to a time earlier than the component run-out time such that the exchange periods for each feeder do not overlap.

3. The automatic feeder exchanging system according to claim 1, further provided with
    a used feeder collection area in which used feeders for which components have been completely used up are collected,
    wherein
    the exchange robot, in a case in which the feeder pulled out from the feeder setting area is a used feeder, collects the used feeder in the used feeder collection area.

4. The automatic feeder exchanging system according to claim 1, further provided with
    a feeder monitoring means that monitors whether feeders that supply the same components as each of the feeders set in the feeder setting area are present in the feeder stock area, and
    a guidance means that guides an operator with at least one of a display or a sound to replenish the feeder stock area with feeders that supply components for feeders of components that the feeder monitoring means has determined are not present in the feeder stock area.

5. The automatic feeder exchanging system according to claim 1, wherein
    an identification information recording section on which feeder identification information is recorded or stored is provided on the feeders,
    an identification information reading section that reads the feeder identification information from the identification recording section of the feeders standing by in the feeder stock area is provided in the feeder stock area, and
    a control means that controls the exchange robot identifies the feeders based on the feeder identification information sent from the identification information reading section.

6. The automatic feeder exchanging system according to claim 1, further provided with
    a feeder transport conveyor that performs loading of feeders for replenishment to the feeder stock area and unloading of used feeders, and
    a switching robot that switches feeders between the conveyor and the feeder stock area.

7. The automatic feeder exchanging system according to claim 1, wherein
    the feeders are cassette-type feeders provided with
    a tape loading section that loads wound component supply tape,
    a tape feed mechanism that feeds component supply tape pulled out from the tape loading section to a component pickup position,
    a cover tape peeling mechanism that exposes components in the component supply tape by peeling cover tape from the component supply tape forward of the component pickup position, and a cassette case built into which are the tape loading section, the tape feed mechanism, and the cover tape peeling mechanism.

\* \* \* \* \*